(12) United States Patent
Matsuo et al.

(10) Patent No.: US 7,220,133 B2
(45) Date of Patent: May 22, 2007

(54) OPTICAL DISC APPARATUS

(75) Inventors: Masahiro Matsuo, Tokyo (JP); Yoichi Narui, Matsudo (JP); Kohei Takita, Mitaka (JP)

(73) Assignee: Hitachi-LG Data Storage, Inc., Tokyo (JP)

( * ) Notice: Subject to any disclaimer, the term of this patent is extended or adjusted under 35 U.S.C. 154(b) by 0 days.

(21) Appl. No.: 11/368,592

(22) Filed: Mar. 7, 2006

(65) Prior Publication Data
US 2007/0042616 A1    Feb. 22, 2007

(30) Foreign Application Priority Data
Aug. 22, 2005 (JP) ............... 2005-239326

(51) Int. Cl.
*H01R 12/00* (2006.01)
(52) U.S. Cl. ............. 439/67; 439/493; 439/260; 439/329
(58) Field of Classification Search ................ 439/67, 439/493, 260, 329
See application file for complete search history.

(56) References Cited
U.S. PATENT DOCUMENTS
4,116,517 A * 9/1978 Selvin et al. ............... 439/67

6,171,114 B1 * 1/2001 Gillette et al. ............... 439/67
6,739,878 B1 * 5/2004 Balzano ....................... 439/67
7,094,067 B2 * 8/2006 Kitagawa ..................... 439/67

FOREIGN PATENT DOCUMENTS
JP           64-39691           3/1989

* cited by examiner

*Primary Examiner*—Truc Nguyen
(74) *Attorney, Agent, or Firm*—McDermott Will & Emery LLP

(57) ABSTRACT

An optical disc apparatus is constructed so that: a first member formed of a plate-shaped or sheet-shaped insulating material is disposed on a flexible printed-wiring board which interconnects a main circuit board and an optical pickup; a second member with a protruding portion is disposed at both sides of the wiring section of the flexible printed-wiring board, on the first member; the protrusions are coupled with a main circuit board by, for example, being inserted into the holes of a planar region on the main circuit board; and the second member presses the flexible printed-wiring board against the main circuit board from one side of the wiring board via the first member, thus fixing the wiring board.

8 Claims, 6 Drawing Sheets

OPTICAL DISC APPARATUS

CLAIM OF PRIORITY

The present application claims priority from Japanese application serial No. P2005-239326, filed on Aug. 22, 2005, the content of which is hereby incorporated by reference into this application.

BACKGROUND OF THE INVENTION

1. Technical Field of the Invention

The present invention relates to an optical disc apparatus in which an optical pickup and a circuit board with a signal-processing circuit are interconnected via a flexible printed-wiring circuit board. The invention relates more particularly to a technique for protecting an electrical line of the wiring board.

2. Description of the Related Art

Optical disc apparatuses having an optical pickup adapted to enable the emission of tri-channel laser light inclusive of blue laser light are coming to be used in recent years. Such an optical pickup is dimensionally increasing, and at the same time, a flexible printed-wiring board is also growing in surface area with a quantitative increase in wiring. Since using connectors to connect such a flexible printed-wiring board to the optical pickup is liable to render the reliability of the connection unable to be ensured, the flexible printed-wiring board is connected to the optical pickup directly, not via connectors. Accordingly, if the causes of defects such as damage occur in the flexible printed-wiring board, the optical pickup also requires replacement, which poses problems associated with costs, in particular. If the flexible printed-wiring board with a large surface area is of a fold-back structure, the fold-back portion increases in curvature radius, thus causing further inconvenience such as swelling the wiring board at the optical pickup side and bringing the swelling section into contact with the moving optical pickup. Technology that allows the flexible printed-wiring board to be fixed to prevent or suppress such swelling and protect the wiring board is being called for to improve the above problems.

Conventional techniques related to the present invention and intended to keep the fold-back portion of a flexible printed-wiring board from swelling include the technique described in, for example, Japanese Utility Model Registration No. Sho 64-39691. This Publication describes the technique for fixing a band-shaped flexible printed-wiring strip (flexible printed-wiring board) by, at the fold-back portion of the wiring board that is formed at the end of a fixing plate member, holding down the fixing plate member and both sides of the wiring strip flexibly, in the direction of the plate thickness, and in sandwiched form, with a perpendicularly cornered rectangular hook-shaped clamping member.

In such conventional technique as outlined above, the perpendicularly cornered rectangular hook-shaped clamping member is abutted directly on the surface of the flexible printed-wiring strip and the resilience of the clamping member presses the surface of the flexible printed-wiring strip to fix the wiring strip. This construction of the flexible printed-wiring strip, however, is likely to cause several unfavorable events. (1) A first unfavorable event is that since stress concentration on the flexible printed-wiring strip easily occurs at the edge of the clamping member, the wiring section of the flexible printed-wiring strip is prone to damage. (2) A second unfavorable event is that since the clamping member presses the surface of the flexible printed-wiring strip, the surface easily becomes damaged, and that this also happens when the clamping member is mounted. (3) A third unfavorable event is that the use of the perpendicularly cornered rectangular hook-shaped clamping member dimensionally increases an associated planar section.

With the above situation of the conventional technique taken into account, the present invention was made so that the internal flexible printed-wiring board of an optical disc apparatus that interconnects an optical pickup and a circuit board having a signal-processing circuit can be fixed without forming a swelling section, even at a fold-back portion, by using a method that enables easy mounting in a simplified configuration and does not damage the surface or wiring section of the flexible printed-wiring board.

An objective of the present invention is to provide an optical disc apparatus that solves related problems and is improved in reliability.

SUMMARY OF THE INVENTION

The present invention is a technique freed of related problems.

That is to say, the invention is adapted so that in an optical disc apparatus, a flexible printed-wiring board which interconnects a main circuit board and an optical pickup is fixed using the method outlined below. A first member formed of a plate-shaped or sheet-shaped insulating material is disposed on the flexible printed-wiring board, and a second member with a protruding portion is disposed at both sides of a wiring section of the flexible printed-wiring board, on the first member. The protrusions are coupled with a main circuit board by, for example, being inserted into holes of a planar region on the main circuit board, and the second member presses the flexible printed-wiring board against the main circuit board from one side of the wiring board via the first member, thus fixing the wiring board.

According to the present invention, it is possible to prevent damage to the flexible printed-wiring board of an optical disc apparatus that interconnects a main circuit board and an optical pickup, and hence to improve the apparatus in reliability.

DETAILED DESCRIPTION OF THE PREFERRED EMBODIMENTS

Embodiments of the present invention will be described hereunder using the accompanying drawings.

Figure 1:
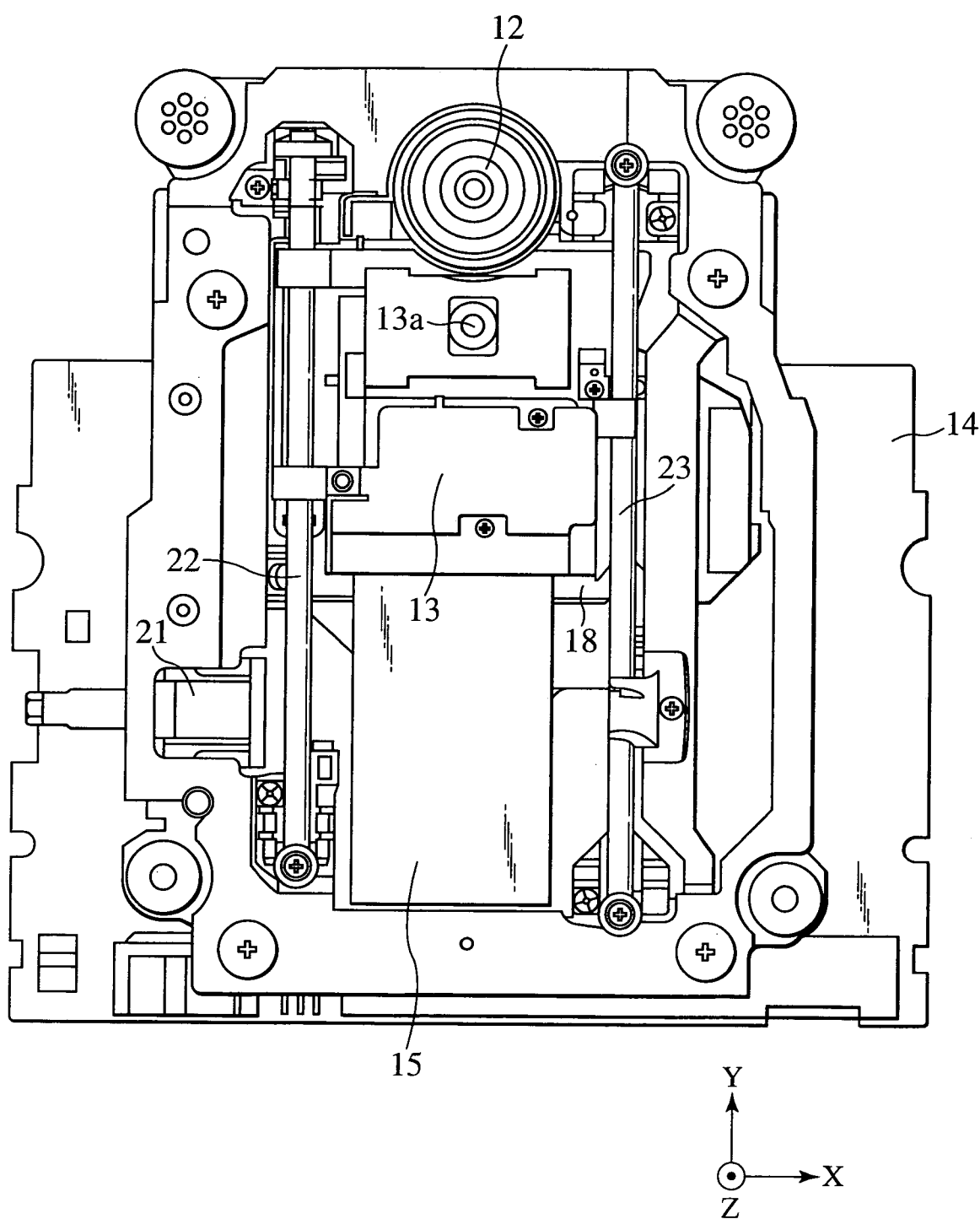
FIG. 1 is a structural view showing an example of an optical disc apparatus which is a first embodiment of the present invention.
Figure 2:
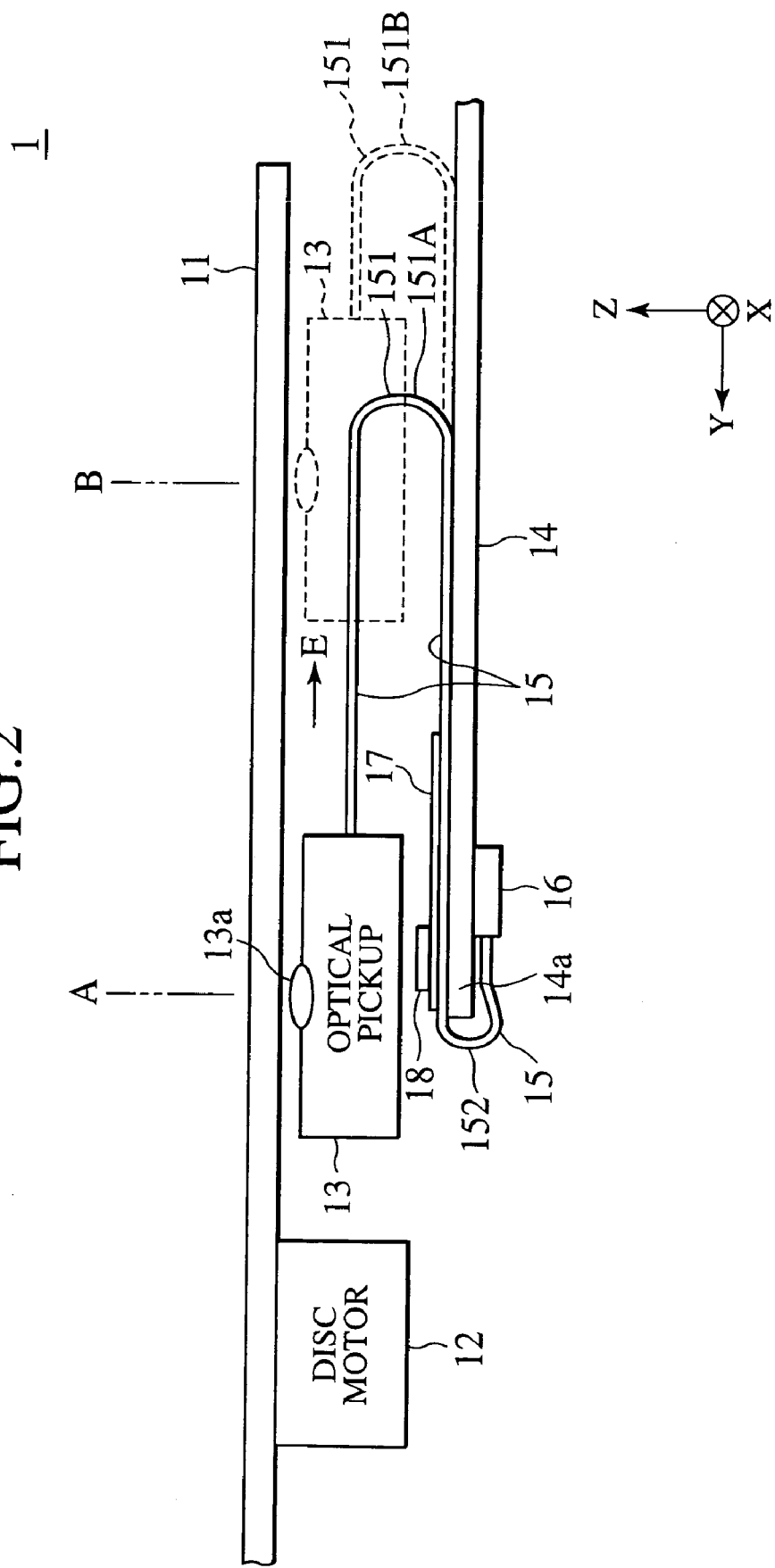
FIG. 2 is an explanatory diagram showing a lateral configuration of the optical disc apparatus shown in FIG. 1.
Figure 3:
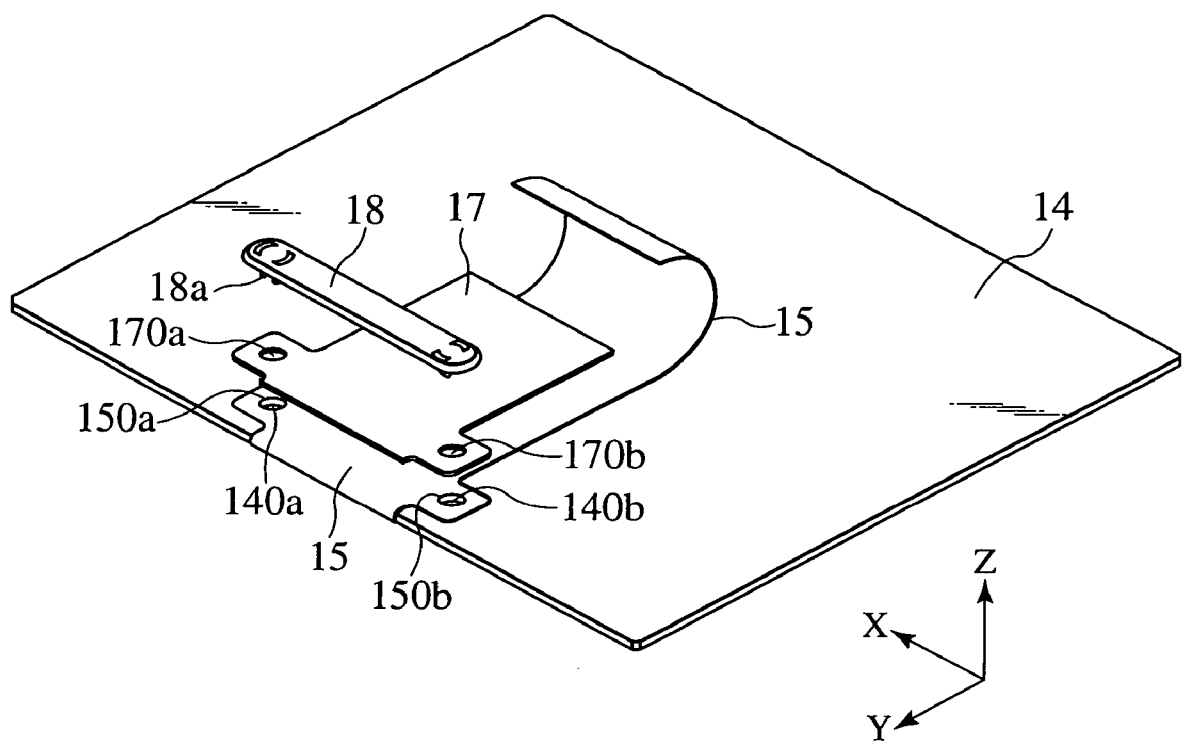
FIG. 3 is an explanatory diagram showing a fixed structure of a flexible printed-wiring board within the optical disc apparatus of FIG. 1.
Figure 4:
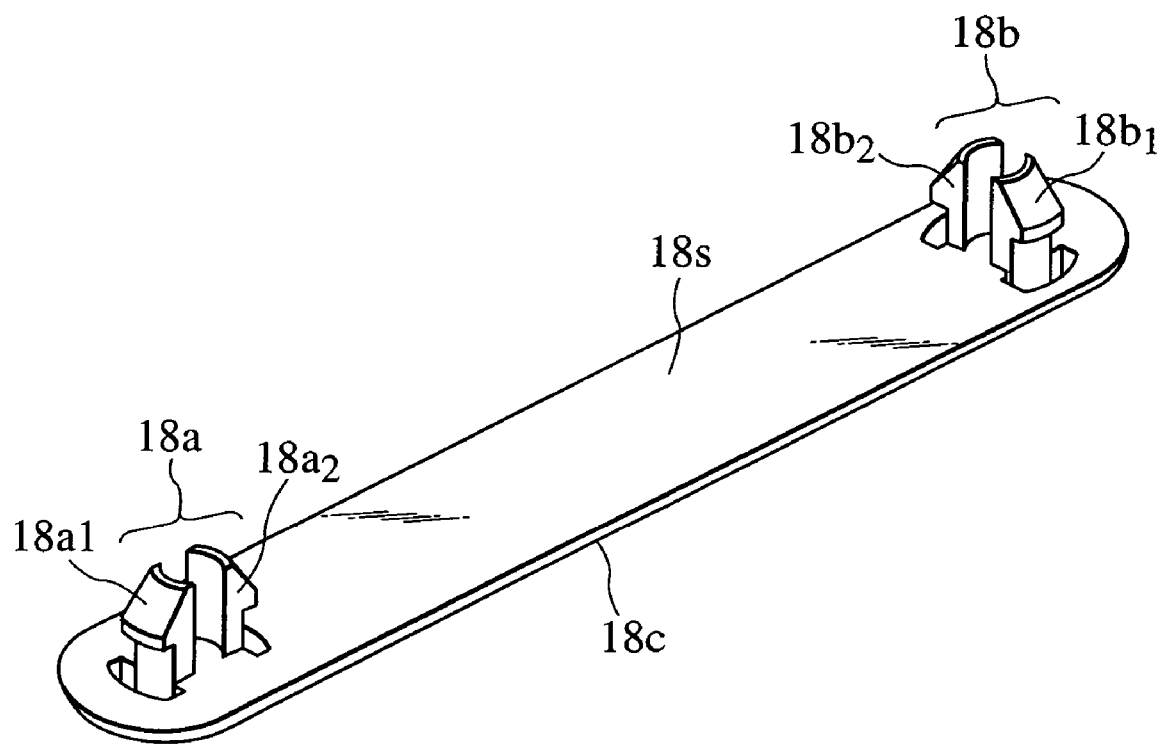
FIG. 4 is a structural view showing an example of a fixing member for the flexible printed-wiring board within the optical disc apparatus of FIG. 1.

FIGS. 1 to 4 are explanatory diagrams or structural views of a first embodiment of the present invention. FIG. 1 is a plan view showing a structural example of an optical disc apparatus which is the first embodiment of the present invention. FIG. 2 is an explanatory diagram showing a lateral configuration of the optical disc apparatus shown in FIG. 1. FIG. 3 is an explanatory diagram showing a fixed structure of a fold-back portion of a flexible printed-wiring board. FIG. 4 is a structural view showing an example of a fixing member, namely, a second member for fixing the flexible printed-wiring board. In these figures, the same constituent elements of the optical disc apparatus are each assigned the same reference number of symbol.

The present invention assumes that the optical disc apparatus of the first embodiment includes an optical pickup adapted to allow emission of three-channel laser light, namely, blue laser light, laser light for CD use, and laser light for DVD use. The present invention also assumes that the flexible printed-wiring board for interconnecting the optical pickup and a main circuit board has an appropriate quantity-of-wiring and surface area according to the particular optical pickup. In addition, the present invention assumes that the flexible printed-wiring board is directly connected to the optical pickup, not via an element such as a connector, by soldering or the like. Furthermore, the present invention assumes that the flexible printed-wiring board is connector-connected to the main circuit board via a fold-back portion.

Reference number 1 in FIG. 1 denotes the optical disc apparatus, 12 a disc motor that rotationally drives an optical disc (not shown), 13 the optical pickup that records information on or reproduces information from the optical disc while moving in a radial direction thereof, and 13a an objective lens provided inside the optical pickup 13. Reference number 14 denotes the main circuit board, 15 the flexible printed-wiring board for interconnecting the optical pickup 13 and the main circuit board 14, and 18 the second member for fixing the flexible printed-wiring board 15 to the main circuit board 14. Reference number 21 denotes a stepping motor that rotationally drives a lead screw member (not shown) to move the optical pickup 13 in approximately the radial direction of the optical disc, and 22, 23 each denote a guide member for guiding the movement of the optical pickup in approximately the radial direction of the optical disc 13.

A signal-processing circuit, that is, a circuit that undertakes signal processing such as generating a reading or reproduction signal which is exchanged with the optical pickup 13, is mounted on the main circuit board 14. A control circuit such as a digital signal processor (DSP) or microcomputer circuit, a driving circuit for driving a motor such as the disc motor 12, and other circuits are also mounted on the main circuit board 14. The flexible printed-wiring board 15 has its wiring conductor connected to a wiring terminal within the optical pickup 13, at an opposite position to the disc motor 12 across the optical pickup, by soldering or the like. The flexible printed-wiring board 15 also has a band-shaped section extending in a minus direction of the Y-axis shown as a coordinate axis in FIG. 1, and the band-shaped section is folded back at an appropriate longitudinal position to form a first fold-back portion. The band-shaped section, after further extending along a Z-axial face of the main circuit board 14 first and then in the Y-axial direction, is fixed to nearly a required end portion of the main circuit board 14 by the fixing member 18 in the state where the banded-shaped section is pressed against the surface of the circuit board 14. A further end from the fixed end portion of the band-shaped section of the flexible printed-wiring board 15 forms a second fold-back portion at the end of the main circuit board 14. At the second fold-back portion, the band-shaped section is bent towards the face of the main circuit board 14 that points in a minus direction of the Z-axis. The band-shaped section is thus connected to a connector (not shown) on the face of the main circuit board 14 that points in the minus direction of the Z-axis. More specifically, the band-shaped section is routed as in FIG. 2. The first fold-back portion is formed between the optical disc (not shown) and the face of the main circuit board 14 that points in the plus direction of the Z-axis. As the optical pickup 13a moves, therefore, the first fold-back portion changes in Y-axial or minus Y-axial position. The second fold-back portion is formed at the end of the main circuit board 14, as described above, and the end fixed by the fixing member 18 is provided between the second fold-back portion and the first fold-back portion. The second fold-back portion, therefore, changes in neither position nor shape with the movement of the optical pickup 13.

While, in the structural view of FIG. 1, a longitudinal direction of the fixing member 18 is approximately orthogonal to that of the flexible printed-wiring board 15, a mounting direction of the fixing member is not limited to the present embodiment and may obliquely intersect with the longitudinal direction of the wiring board. The present embodiment also assumes that although this is not shown in the structural view of FIG. 1, a first member formed of a plate-shaped or sheet-shaped insulating material and capable of reinforcing the flexible printed-wiring board 15 is disposed in a state of tight contact with the wiring board 15, between the fixing member 18 and the wiring board 15. In addition, the present embodiment assumes that the first member is fixed to the surface of the flexible printed-wiring board 15 via a bonding agent or a pressure-sensitive adhesive.

The reference numbers or symbols used in the description given below have the same meanings as those of the numbers or symbols assigned to the constituent elements in FIG. 1.

FIG. 2 is an explanatory diagram showing the lateral configuration of the optical disc apparatus shown in FIG. 1.

Reference number 17 in FIG. 2 denotes a protecting member that serves as the first member formed of a plate-shaped or sheet-shaped insulating material, disposed in a state of tight contact with the flexible printed-wiring board 15, and capable of reinforcing the wiring board. Reference number 14a denotes the end of the main circuit board 14, 16 the connector, 151 the first fold-back portion of the flexible printed-wiring board 15, and 152 the second fold-back portion thereof. Reference number 151A denotes a position that the first fold-back portion takes up when the optical pickup 13 is present at a position A, and 151B denotes a position that the first fold-back portion takes up when the optical pickup 13 is present at a position B. Meanings of other reference numbers or symbols are the same as for FIG. 1. At the portion of the flexible printed-wiring board 15 that is near the end 14a of the main circuit board 14, the protecting member 17 that serves as the first member is fixed to the surface of the wiring board via a bonding agent or a pressure-sensitive adhesive. The fixing member 18 that serves as the second member is further disposed on the protecting member 17. The fixing member 18 has a protrusion, although not shown in FIG. 2, at portions corresponding to both sides of a wiring section of the flexible printed-wiring board 15, namely, at spatial intervals wider than the wiring section of the wiring board 15. The fixing member 18 is constructed so that the protrusions are inserted into holes of the main circuit board 14 in a planar region thereof and thus coupled to the circuit board 14. The fixing member 18 is thus constructed to fix the flexible printed-wiring board 15 via the protecting member 17 by pressing the wiring board 15 against the surface of the main circuit board 14. Since the flexible printed-wiring board 15 is fixed in this fashion, the second fold-back portion 152 has a fold-back shape free of swelling of the wiring board.

In FIG. 2, when the optical pickup 13 moves from position A to position B by sliding in approximately the radial direction of the optical disc (i.e., in a direction of arrow E), the first fold-back portion 151 of the flexible printed-wiring board 15 moves from position 151A to position 151B and changes in shape with the movement. When the optical pickup 13 moves from position B to position A, the first fold-back portion 151 moves from position 151B to position 151A and correspondingly changes in shape. Between the first fold-back portion 151 and the fixed portion formed by the fixing member 18 and the protecting member 17, the surface of the flexible printed-wiring board 15 is kept almost constant along the surface of the main circuit board 14, even during the movement of the optical pickup 13. Since the fixing member 18 and the protecting member 17 cuts off any effects that the movement of the optical pickup 13 has, the second fold-back portion 152 also has its fold-back shape and its fold-back position kept constant without changing.

FIG. 3 is an explanatory diagram showing the structure of the flexible printed-wiring board 15 when it is fixed to the main circuit board 14, at the fold-back portion 152.

Reference numbers 18a, 18b in FIG. 3 denote the protrusions provided on the fixing member 18. Reference numbers 140a, 140b denote holes provided in the plane of the main circuit board 14 to insert the respective protrusions 18a, 18b of the fixing member 18 are inserted into the respective holes. Reference numbers 150a, 150b denote holes provided outside the wiring section of the flexible printed-wiring board 15, these holes also being for the insertion of the respective protrusions 18a, 18b. Reference numbers 170a, 170b denote holes provided in a plane of the protecting member 17, these holes further being used to insert the respective protrusions 18a, 18b. The protrusion 18a extends through the holes 170a, 150a, and is inserted into the hole 140a. The protrusion 18b extends through the holes 170b, 150b, and is inserted into the hole 140b. Thus, the flexible printed-wiring board 15 is fixed to the required holes in the plane of the main circuit board 14. In the structural view of FIG. 3, since the protecting member 17 has the holes 170a, 170b, even if the protecting member is not fixed to the surface of the flexible printed-wiring board 15 via a bonding agent or a pressure-sensitive adhesive, the protecting member can be properly positioned with respect to the flexible printed-wiring board 15.

FIG. 4 is a structural view that represents an example of the fixing member 18 serving as the second member, and shows a configuration of both sides opposed to the protecting member 17 serving as the first member. In the fixing member 18 of FIG. 4, reference number 18s denotes a face opposed to the protecting member 17, and 18c denotes a main-body section that forms the opposed face 18s and couples the protrusions 18a and 18b with each other. In this configuration, the protrusions 18a and 18b are both constituted as a pair of two pieces, the protrusion 18a being formed up of protruding pieces $18a_1$ and $18a_2$ and the protrusion 18b being formed up of protruding pieces $18b_1$ and $18b_2$. The fixing member 18 is constructed by, for example, molding a plastic material. The protruding pieces $18a_1$ and $18a_2$ constituting the protrusion 18a, and the protruding pieces $18b_1$ and $18b_2$ constituting the protrusion 18b are also constructed into a continuum integrated with the main-body section 18c. The protrusions $18a_1$, $18a_2$, $18b_1$, $18b_2$ each have a hook-shaped portion formed of an outward overhang at a front end of the protrusion, and are each adapted to be susceptible of elastic bending/deformation. In addition, the protrusions $18a_1$, $18a_2$ are arrayed in an orthogonal fashion with respect to each other. The same also applies to the protrusions $18b_1$, $18b_2$. The paired protrusions $18a_1$, $18a_2$ and the paired protrusions $18b_1$, $18b_2$ are inserted in an elastically bent/deformed fashion into the holes 140a, 140b provided in the plane of the main circuit board 14. After the insertion, the spatial intervals between the hook-shaped portions are spread to prevent the protrusions $18a_1$, $18a_2$, $18b_1$, $18b_2$ from dislodging from the holes 140a, 140b. After the insertion of the protrusions $18a_1$, $18a_2$, $18b_1$, $18b_2$ into the holes 140a, 140b, the opposed face 18s presses the flexible printed-wiring board 15 against the main circuit board 14 via the protecting member 17 to fix the wiring board.

According to the optical disc apparatus 1 of the above first embodiment, a technique that allows simplified construction and easy mounting makes it possible to prevent damage to the flexible printed-wiring board 15 for interconnecting the optical pickup 13 and the main circuit board 14, and improve the apparatus in reliability. In particular, because of the construction in which the protecting member 17 as the first member, and the fixing member 18 as the second member are used to fix the flexible printed-wiring board 15 to the main circuit board 14, the protecting member 17 makes it possible to avoid, for example, concentration of stresses on the flexible printed-wiring board 15 and to enhance a protection effect of the wiring board 15. Additionally, during the mounting of the fixing member 18, since the fixing member 18 is mounted on the flexible printed-wiring board 15 and the protecting member 17, the mounting operation can be easily performed without damaging the flexible printed-wiring board 15. Furthermore, the construction with the fixing member 18 coupled to the main circuit board 14 in the planar region thereof prevents the fixed portion from increasing in plane size.

In the above first embodiment, the protrusions 18a, 18b of the fixing member 18 are inserted into the respective holes 140a, 140b of the main circuit board 14 to cause the flexible printed-wiring board 15 to be pressed against and fixed to the main circuit board. However, if a method is usable that yields operation/effect essentially equivalent to that of the holes 140a, 140b, this method may be used to engage the protrusions of the fixing member 18 with the main circuit board 14. Additionally, in the above first embodiment, the flexible printed-wiring board 15 is adapted to be directly connected to the optical pickup 13 by soldering or the like, not by using a connector, and to be connected to the main circuit board 14 via the connector 16. In the present invention, however, the above connecting operations can use any other method that yields operation/effect essentially equivalent to or greater than that of soldering or the like or of connector usage. Effects of the present invention become particularly remarkable in the construction with the flexible printed-wiring board 15 directly connected to the optical pickup 13.

Figure 5:
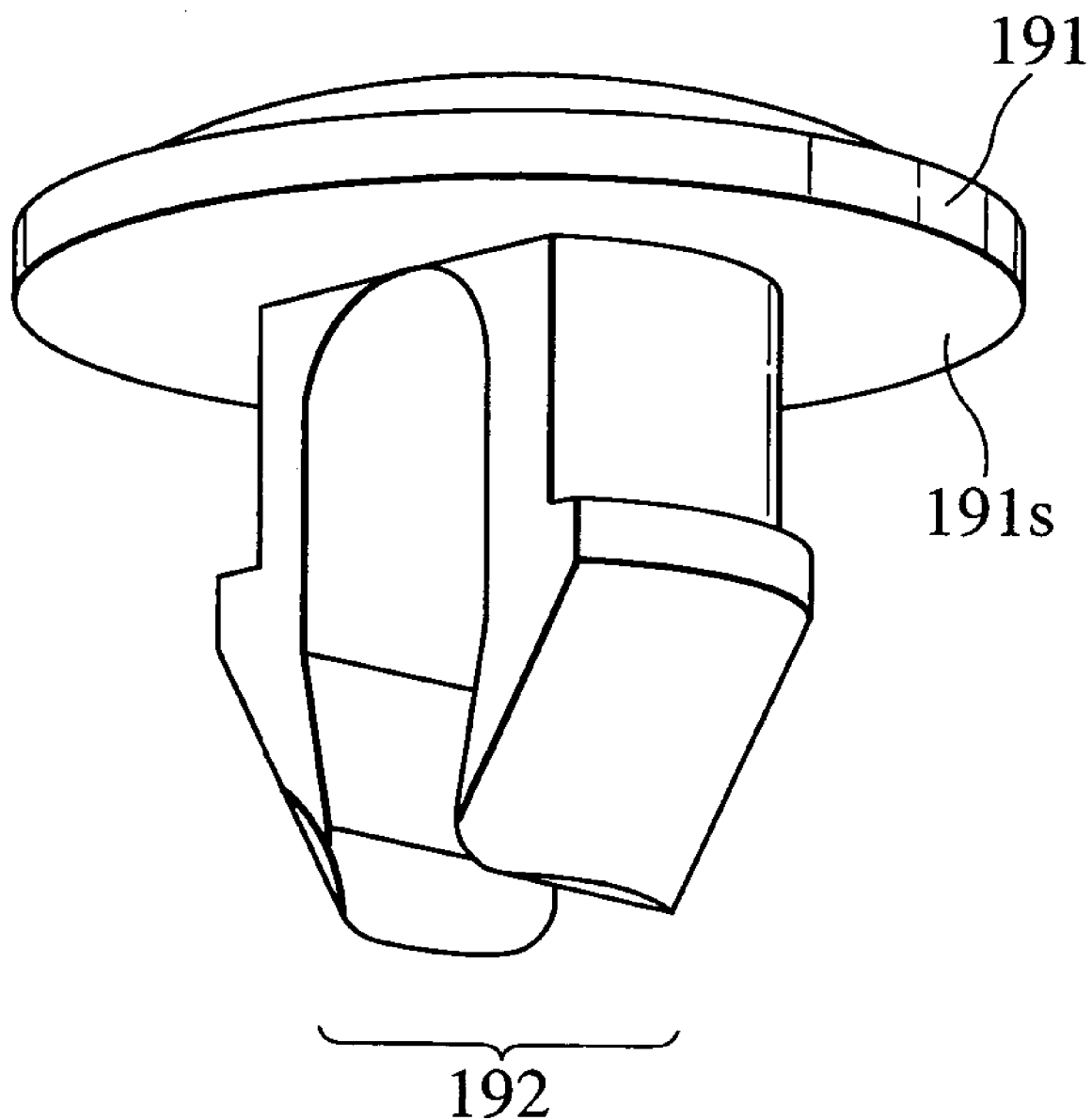
FIG. 5 is a structural view showing an example of a fixing member for a flexible printed-wiring board in a second embodiment of the present invention.
Figure 6:
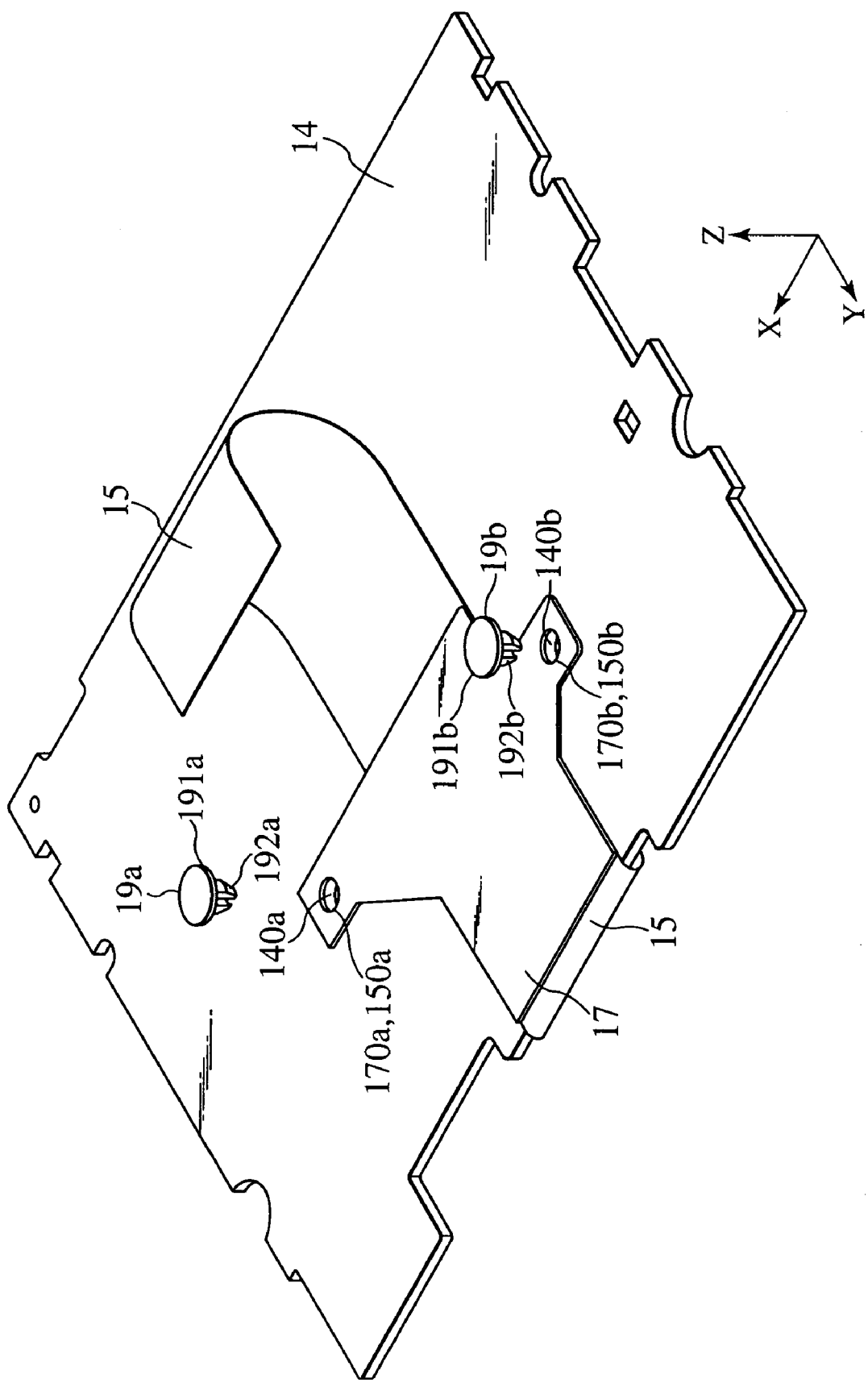
FIG. 6 is an explanatory diagram showing a fixed structure of the flexible printed-wiring board in the second embodiment of the present invention.

FIGS. 5 and 6 are explanatory diagrams showing a second embodiment of the present invention. In the above first embodiment, the fixing member 18 as the second member has two protrusions, 18a, 18b, on one main-body section 18c, and the protrusions 18a, 18b are adapted to be engaged with the main circuit board 14 at both sides of the flexible printed-wiring board 15 in a lateral direction thereof. A fixing member in the second embodiment, however, is constructed to have an independent main-body section for each protrusion, and independent such fixing member is disposed at both sides of a flexible printed-wiring board 15 in a lateral direction thereof. At respective sections, the flexible printed-wiring board 15 is pressed against and fixed to a main circuit board 14 via a protecting member 17.

FIG. 5 is a structural view showing an example of a fixing member in the second embodiment of the present invention.

Reference number 19 in FIG. 5 denotes the fixing member as a second member, 191 a main-body section thereof, 191s a face constructed on the main-body section 191 and opposed to the protecting member 17, and 192 a protrusion. In the present second embodiment, a plurality of (say, two) such fixing members are used, which are arranged at both sides of the flexible printed-wiring board 15 in its lateral direction. At each of both sides of the flexible printed-wiring board 15 in its lateral direction, the protrusion 192 of each fixing member 19 is inserted into holes 140a, 140b provided in a planar region of the main circuit board 14. The opposed face 191s then presses the flexible printed-wiring board 15 against the main circuit board 14 via the protecting member 17, thus fixing the wiring board to the main circuit board.

FIG. 6 is an explanatory diagram showing a structure of the flexible printed-wiring board 15 fixed by the fixing members 19.

Reference numbers 19a, 19b in FIG. 6 denote the fixing members, 191a the main-body section of the fixing member 19a, 191b the main-body section of the fixing member 19b, 192a the protrusion of the fixing member 19a, and 192b the protrusion of the fixing member 19b. As in the above first embodiment, the hole 140a of the main circuit board 14, a hole 150a of the flexible printed-wiring board 15, and a hole 170a of the protecting member 17 are positioned so as to approximately overlap each other. The hole 140b of the main circuit board 14, a hole 150b of the flexible printed-wiring board 15, and a hole 170b of the protecting member 17 are also positioned so as to approximately overlap each other. In addition, the second embodiment assumes that the protecting member 17 is fixed to the surface of the flexible printed-wiring board 15 via a bonding agent or a pressure-sensitive adhesive. In such a configuration, the fixing member 19a has its protrusion 192a extending through the holes 170a, 150a and inserted into the hole 140a. Thus, the main-body section 191a of the fixing member 19a presses a peripheral portion of the hole 150a of the flexible printed-wiring board 15 via the protecting member 17 to fix the wiring board 15 to the main circuit board 14. Likewise, the protrusion 192a extends through the holes 170b, 150b and is inserted into the hole 140b, thus causing the main-body section 191b of the fixing member 19b to press a peripheral portion of the hole 150b of the flexible printed-wiring board 15 via the protecting member 17 and fix the wiring board to the main circuit board 14. Since the protecting member 17 in the structural view of FIG. 6 also has holes 170a, 170b, even if the protecting member is not fixed to the surface of the flexible printed-wiring board 15 via a bonding agent or a pressure-sensitive adhesive, the protecting member can be properly positioned with respect to the wiring board 15.

In the above second embodiment, as in the first embodiment, a technique that allows simplified construction and easy mounting makes it possible to prevent damage to the flexible printed-wiring board 15 for interconnecting an optical pickup 13 and the main circuit board 14, and improve an optical disc apparatus in reliability. In addition, the construction in which the fixing members 19 are coupled to the main circuit board 14 in a planar region thereof prevents the fixed portions from increasing in plane size.

In the above second embodiment, the protrusions 192a, 192b of the fixing members 19a, 19b are also inserted into the respective holes 140a, 140b of the main circuit board 14 to cause the flexible printed-wiring board 15 to be pressed against and fixed to the main circuit board 14. However, if a method is usable that yields operation/effect essentially equivalent to that of the holes 140a, 140b, this method may be used to engage the protrusions 192a, 192b of the fixing members 19 with the main circuit board 14. Additionally, the flexible printed-wiring board 15 may not have the holes 150a, 150b. Instead, the protrusions 192a, 192b of the fixing members 19a, 19b may be constructed so as to extend through the holes 170a, 170b, respectively, in the protecting member 17 and so as to be inserted into the holes 140a, 140b of the main circuit board 14. In such a construction, the flexible printed-wiring board 15 can have its lateral size reduced below that achieved when the holes 150a, 150b are provided, and required positioning of the wiring board via the protecting member 17 and the fixing of the wiring board to the main circuit board 14 are both possible.

The present invention can be embodied in other specific forms without departing from the spirit or essential characteristics thereof. The invention is therefore not to be considered in all respects as illustrative and not restrictive, the scope of the invention being indicated by the appended claims rather than by the foregoing description, and all modifications and changes that come within the meaning and range of equivalency of the claims are therefore intended to be embraced therein.

What is claimed is:

1. An optical disc apparatus using a flexible printed-wiring board to interconnect an optical pickup and a circuit board having a signal-processing circuit, the apparatus comprising:

a first member formed of a plate-shaped or sheet-shaped insulating material, the first member being disposed on the flexible printed-wiring board in close proximity thereto at the side of the circuit board that faces the optical pickup; and a second member having a protrusion in a face opposed to the circuit board or to the first member, the second member being disposed on a face of the first member and the protrusion being coupled to the circuit board in a planar region thereof, wherein the circuit board includes a connector with which the flexible printed-wiring board is electrically connected;

the circuit board and the optical pickup are interconnected with each other by the flexible printed-wiring board folded back at an end of the circuit board; and the second member is adapted to press the flexible printed-wiring board against the face opposed to the first member, via the first member, and fix the flexible printed-wiring board to the circuit board.

2. The optical disc apparatus according to claim 1, wherein the first member is adapted to be fixed to the flexible printed-wiring board via a bonding agent or a pressure-sensitive adhesive.

3. The optical disc apparatus according to claim 1, wherein the circuit board includes, in the planar region thereof, a hole associated with the protrusion of the second member, and wherein the protrusion is inserted into the hole of the circuit board and thus the second member is coupled therewith.

4. The optical disc apparatus according to claim 1, wherein the second member is constructed of a plastic material and integrally formed up of the protrusion and the face opposed to the first member.

5. The optical disc apparatus according to claim 1, wherein the flexible printed-wiring board is connected directly to the optical pickup and connector-connected to the circuit board.

6. The optical disc apparatus according to claim 2, wherein the circuit board includes, in the planar region thereof, a hole associated with the protrusion of the second member, and wherein the protrusion is inserted into the hole of the circuit board and thus the second member is coupled therewith.

7. The optical disc apparatus according to claim 3, wherein either the first member or the flexible printed-wiring board or both thereof are adapted to have a through-hole at a position associated with the hole in the circuit board, and wherein the protrusion of the second member passes the through-hole and is inserted into the hole of the circuit board.

8. The optical disc apparatus according to claim 6, wherein either the first member or the flexible printed-wiring board or both thereof are adapted to have a through-hole at a position associated with the hole in the circuit board, and wherein the protrusion of the second member passes the through-hole and is inserted into the hole of the circuit board.

* * * * *